(12) United States Patent
Liu et al.

(10) Patent No.: US 10,468,341 B2
(45) Date of Patent: Nov. 5, 2019

(54) SEMICONDUCTOR PACKAGE ASSEMBLY

(71) Applicant: MEDIATEK INC., Hsin-Chu (TW)

(72) Inventors: Nai-Wei Liu, Kaohsiung (TW);
Tzu-Hung Lin, Zhubei (TW); I-Hsuan Peng, Hsinchu (TW); Che-Hung Kuo, Tainan (TW); Che-Ya Chou, Kaohsiung (TW); Wei-Che Huang, Zhudong Township, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/232,129

(22) Filed: Dec. 26, 2018

(65) Prior Publication Data
US 2019/0131233 A1  May 2, 2019

Related U.S. Application Data

(63) Continuation of application No. 15/481,500, filed on Apr. 7, 2017, now Pat. No. 10,199,318.
(Continued)

(51) Int. Cl.
*H01L 23/485* (2006.01)
*H01L 23/498* (2006.01)
(Continued)

(52) U.S. Cl.
CPC .... *H01L 23/49838* (2013.01); *H01L 23/3128* (2013.01); *H01L 23/49811* (2013.01); *H01L 23/49827* (2013.01); *H01L 23/5383* (2013.01); *H01L 23/5384* (2013.01); *H01L 23/5385* (2013.01); *H01L 23/5386* (2013.01); *H01L 24/05* (2013.01); *H01L 24/06* (2013.01);
(Continued)

(58) Field of Classification Search
CPC ............. H01L 23/3128; H01L 23/4981; H01L 23/4928; H01L 23/49838; H01L 23/5384; H01L 23/5385; H01L 23/5386; H01L 24/05; H01L 24/06; H01L 24/09; H01L 24/20; H01L 24/49
See application file for complete search history.

(56) References Cited

U.S. PATENT DOCUMENTS 8,084,871 B2  12/2011  Rahim et al.
8,970,017 B1   3/2015  Tarazi et al.
(Continued)

FOREIGN PATENT DOCUMENTS

CN  102598259 A   7/2012
JP  S60154652      8/1985
(Continued)

*Primary Examiner* — Cuong Q Nguyen
(74) *Attorney, Agent, or Firm* — McClure, Qualey & Rodack, LLP

(57) ABSTRACT

A semiconductor package assembly includes a redistribution layer (RDL) structure, which RDL structure includes a conductive trace. A redistribution layer (RDL) contact pad is electrically coupled to the conductive trace, and the RDL contact pad is composed of a symmetrical portion and an extended wing portion connected to the symmetrical portion. The RDL structure includes a first region for a semiconductor die to be disposed thereon and a second region surrounding the first region, and the extended wing portion of the RDL contact pad is offset from a center of the first region.

28 Claims, 14 Drawing Sheets

Related U.S. Application Data

(60) Provisional application No. 62/338,555, filed on May 19, 2016.

(51) Int. Cl.
*H01L 23/31* (2006.01)
*H01L 23/00* (2006.01)
*H01L 25/065* (2006.01)
*H01L 23/538* (2006.01)
*H01L 25/10* (2006.01)

(52) U.S. Cl.
CPC .............. *H01L 24/09* (2013.01); *H01L 24/19* (2013.01); *H01L 24/20* (2013.01); *H01L 24/49* (2013.01); *H01L 25/0657* (2013.01); *H01L 24/48* (2013.01); *H01L 25/0655* (2013.01); *H01L 25/105* (2013.01); *H01L 2224/0235* (2013.01); *H01L 2224/02331* (2013.01); *H01L 2224/02375* (2013.01); *H01L 2224/0401* (2013.01); *H01L 2224/04042* (2013.01); *H01L 2224/04105* (2013.01); *H01L 2224/05552* (2013.01); *H01L 2224/05569* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/48229* (2013.01); *H01L 2224/73265* (2013.01); *H01L 2225/0651* (2013.01); *H01L 2225/06562* (2013.01); *H01L 2225/1035* (2013.01); *H01L 2225/1041* (2013.01); *H01L 2225/1058* (2013.01); *H01L 2924/1421* (2013.01); *H01L 2924/1436* (2013.01); *H01L 2924/1438* (2013.01); *H01L 2924/15311* (2013.01); *H01L 2924/351* (2013.01); *H01L 2924/3512* (2013.01)

(56) References Cited

U.S. PATENT DOCUMENTS

| | | |
|---|---|---|
| 9,490,192 B1 | 11/2016 | Chen et al. |
| 2003/0215982 A1 | 11/2003 | Shimizu et al. |
| 2006/0066327 A1* | 3/2006 | Bachman ................ H01L 24/10 324/754.03 |
| 2011/0108981 A1 | 5/2011 | Rahim et al. |
| 2013/0049206 A1* | 2/2013 | Ryan ....................... H01L 24/05 257/773 |
| 2015/0287700 A1 | 10/2015 | Yu et al. |
| 2015/0364404 A1 | 12/2015 | Chen et al. |
| 2017/0188458 A1 | 6/2017 | Hsieh et al. |
| 2017/0228529 A1 | 8/2017 | Huang et al. |

FOREIGN PATENT DOCUMENTS

| | | |
|---|---|---|
| JP | H10284500 | 10/1998 |
| JP | 2004087764 A | 3/2004 |
| TW | 201436134 A | 9/2014 |
| TW | 201436148 A | 9/2014 |
| TW | 201519391 A | 5/2015 |
| TW | 201521169 A | 6/2015 |
| TW | 201530708 A | 8/2015 |

\* cited by examiner

SEMICONDUCTOR PACKAGE ASSEMBLY

CROSS REFERENCE TO RELATED APPLICATIONS

This application is a Continuation of pending U.S. application Ser. No. 15/481,500, filed on Apr. 7, 2017, which claims the benefit of U.S. Provisional Application No. 62/338,555 filed May 19, 2016, the entireties of which are incorporated by reference herein.

BACKGROUND OF THE INVENTION

Field of the Invention

The present invention relates to a semiconductor package assembly, and in particular to a design of a redistribution layer (RDL) contact pad of a redistribution layer (RDL) structure.

Description of the Related Art

In order to ensure the continued miniaturization and multi-functionality of electric products and communication devices, it is desired that semiconductor packages be small in size, support multi-pin connection, operate at high speeds, and have high functionality. The impact of this will be pressure on semiconductor package fabricators to develop fan-out semiconductor packages. However, the increased amount of input/output connections of a multi-functional chip package may induce thermal electrical problems, for example, problems with heat dissipation, cross talk, signal propagation delay, electromagnetic interference in RF circuits, etc. The thermal electrical problems may affect the reliability and quality of products.

Thus, a novel semiconductor package assembly is desirable.

BRIEF SUMMARY OF THE INVENTION

An exemplary embodiment of a semiconductor package assembly is provided. The semiconductor package assembly includes a redistribution layer (RDL) structure. The RDL structure includes a conductive trace. A redistribution layer (RDL) contact pad is electrically coupled to the conductive trace. The RDL contact pad is composed of a symmetrical portion and an extended wing portion connected to the symmetrical portion. The RDL structure comprises a first region for a semiconductor die to be disposed thereon and a second region surrounding the first region, and the extended wing portion of the RDL contact pad is offset from a center of the first region.

Another exemplary embodiment of a semiconductor package assembly includes a redistribution layer (RDL) structure. The RDL structure includes a conductive trace. A redistribution layer (RDL) contact pad electrically coupled to the conductive trace. The RDL contact pad is composed of a symmetrical portion and an extended wing portion connected to the first portion. The RDL structure comprises a first region for a semiconductor die to be disposed thereon and a second region surrounding the first region, and the extended wing portion of the RDL contact pad is offset from a center of the first region.

Yet another exemplary embodiment of a semiconductor package assembly includes a redistribution layer (RDL) structure. The RDL structure includes a conductive trace. A redistribution layer (RDL) contact pad electrically coupled to the conductive trace. The RDL contact pad comprising a first portion and a second portion, wherein the first portion is a first symmetrical shape, the second portion has different shape from the first portion. The RDL structure further comprises a first region for a semiconductor die to be disposed thereon and a second region surrounding the first region, and the extended wing portion of the RDL contact pad is offset from a center of the first region.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
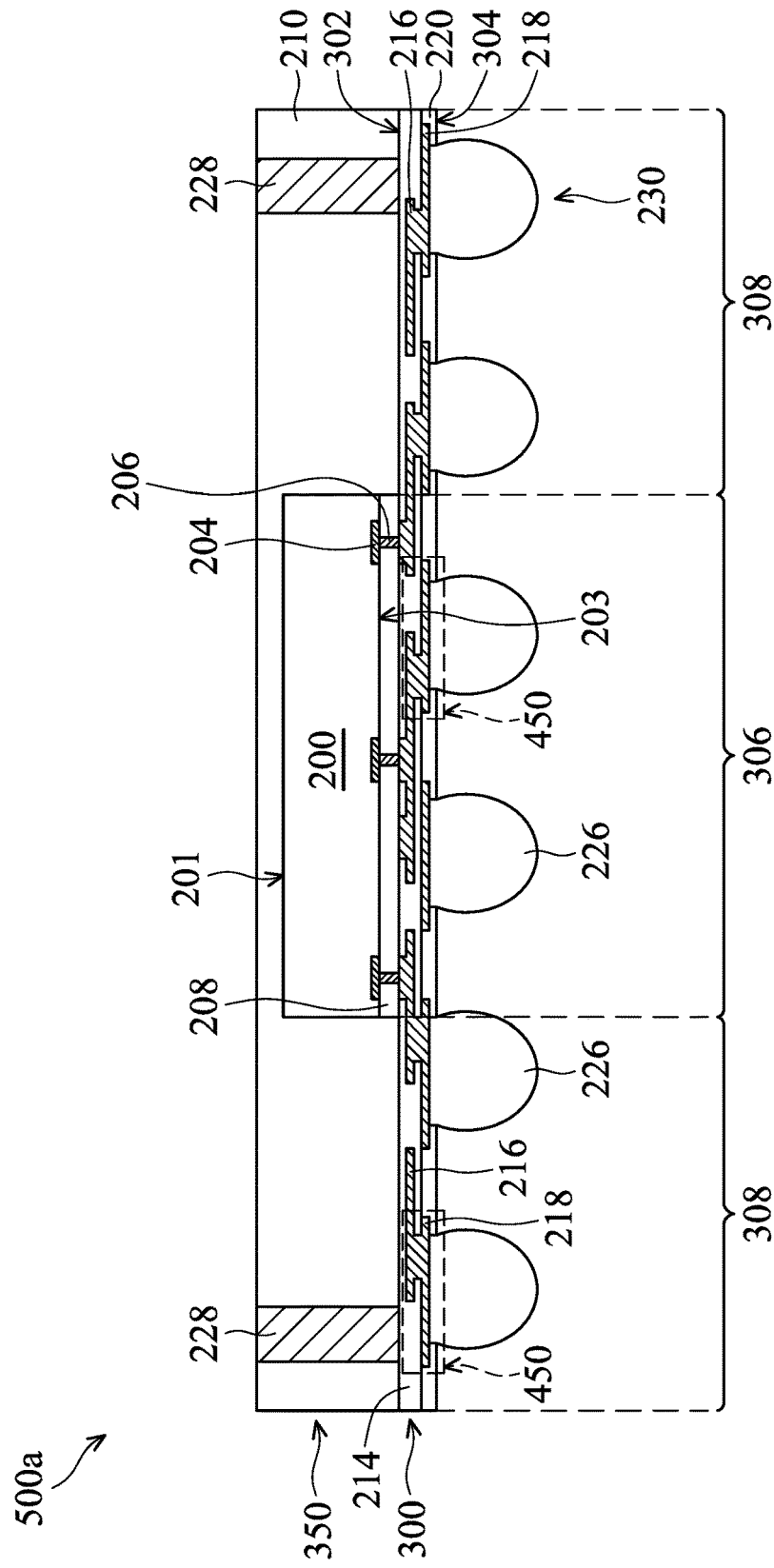
FIG. 1 is a cross-sectional view of a semiconductor package assembly in accordance with some embodiments of the disclosure.

FIG. 1 is a cross-sectional view of a semiconductor package assembly 500a in accordance with some embodiments of the disclosure. In some embodiments, the semiconductor package assembly 500a includes a fan-out wafer-level semiconductor package (FOWLP) 350, for example, a flip-chip semiconductor package. It should be noted that the fan-out wafer-level semiconductor package (FOWLP) 350 used in the semiconductor package assembly 500a is merely an example and is not intended to limit the disclosed embodiment.

In some embodiments, the fan-out wafer-level semiconductor package (FOWLP) 350 of the semiconductor package assembly 500a may include a pure system-on-chip (SOC) package or a hybrid system-on-chip (SOC) package (including a dynamic random access memory (DRAM), a power management integrated circuit (PMIC), a flash memory, a global positioning system (GPS) device or a radio frequency (RF) device). The semiconductor package assembly 500a is mounted on the base (not shown), for example a printed circuit board (PCB) formed of polypropylene (PP), by a bonding process.

As shown in FIG. 1, the fan-out wafer-level semiconductor package (FOWLP) 350 of the semiconductor package assembly 500a includes a semiconductor die 200, a molding compound 210, a redistribution layer (RDL) structure 300 and a plurality of conductive structures 226.

As shown in FIG. 1, the semiconductor die 200 has a back-side surface 201 and a front-side surface 203. The semiconductor die 200 is fabricated using flip-chip technology. The semiconductor die 200 includes die pads 204 disposed on the front-side surface 203 to be electrically connected to the circuitry (not shown) of the semiconductor die 200. In some embodiments, the die pads 204 belong to the uppermost metal layer of the interconnection structure (not shown) of the semiconductor die 200.

As shown in FIG. 1, the fan-out wafer-level semiconductor package (FOWLP) 350 of the semiconductor package assembly 500a includes a dielectric layer 208 is formed covering the front-side surface 203 and portions of the die pads 204 of the semiconductor die 200. The semiconductor package assembly 500a further includes conductive vias 206 positioned corresponding to the die pads 204 and disposed on the front-side surface 203 of the semiconductor die 200. The conductive vias 206 pass through the dielectric layer 208. The conductive vias 206 are in contact with and electrically coupled to the die pads 204 of the semiconductor die 200, respectively.

As shown in FIG. 1, the fan-out wafer-level semiconductor package (FOWLP) 350 of the semiconductor package assembly 500a also includes a molding compound 210 surrounding and covering the semiconductor die 200. The molding compound 210 is in contact with the semiconductor die 200. The molding compound 210 also covers the back-side surface 201 of the semiconductor die 200. In some embodiments, the molding compound 210 may be formed of a nonconductive material, such as an epoxy, a resin, a moldable polymer, or the like. The molding compound 210 may be applied while substantially liquid, and then may be cured through a chemical reaction, such as in an epoxy or resin. In some other embodiments, the molding compound 210 may be an ultraviolet (UV) or thermally cured polymer applied as a gel or malleable solid capable of being disposed around the semiconductor die 200, and then may be cured through a UV or thermal curing process. The molding compound 210 may be cured with a mold.

As shown in FIG. 1, the fan-out wafer-level semiconductor package (FOWLP) 350 of the semiconductor package assembly 500a also includes a redistribution layer (RDL) structure 300 is disposed on front-side surface 203 of the semiconductor die 200. In some embodiments, the RDL structure 300 comprises a first region 306, which is provided for the semiconductor die 200 disposed thereon, and a second region 308, which surrounds the first region 306 and is directly covered by the molding compound 210.

As shown in FIG. 1, the RDL structure 300 has a first surface 302 and a second surface 304 opposite to the first surface 302. The first surface 302 of the RDL structure 300 in the second region 308 may be in contact with the molding compound 210. Also, the first surface 302 of the RDL structure 300 in the first region 306 is provided for the semiconductor die 200 disposed thereon and is close to the front-side surface 203 of the semiconductor die 200. Therefore, the first region 306 of the RDL structure 300 also serves as a die region, and the second region 308 of the RDL structure 300 also serves as a molding compound region. In some embodiments, the RDL structure 300 includes conductive traces 216, intermetal dielectric (IMD) layers 214, RDL contact pads 218 and a passivation layer 220.

In some embodiments, one or more conductive traces 216 are disposed in one or more intermetal dielectric (IMD) layers 214 of the RDL structure 300 in the first region 306 and the second region 308. The conductive traces 216 close to the first surface 302 are electrically coupled to the die pads 204 of the semiconductor die 200 through the conductive vias 206 disposed therebetween. Also, the conductive vias 206 and the dielectric layer 208 are in contact with the RDL structure 300. Moreover, the conductive traces 216 are in contact with and electrically connected to corresponding RDL contact pads 218 close to the second surface 304 of the RDL structure 300.

As shown in FIG. 1, the conductive traces 216 of the RDL structure 300 may be designed to fan out from one or more of the die pads 204 of the semiconductor die 200 to provide electrical connections between the semiconductor die 200 and the corresponding RDL contact pads 218. Therefore, the RDL contact pads 218 may have a larger pitch than the die pads 204 of the semiconductor die 200, which may be suitable for a ball grid array or another package mounting system. However, it should be noted that the number of conductive traces 216, the number of IMD layers 214 and the number of RDL contact pads 218 shown in FIG. 1 is only an example and is not a limitation to the present invention.

In some embodiments, as shown in FIG. 1, the passivation layer 220 of the RDL structure 300 covers the IMD layers 214, which is close to the second surface 304 of the RDL structure 300. In some embodiments, the passivation layer 220 serves as a topmost layer of the RDL structure 300. That is to say, a top surface of the passivation layer 220 serves as the second surface 304 of the RDL structure 300. The passivation layer 220 has openings 230 corresponding to the RDL contact pads 218. Therefore, portions of the RDL contact pads 218 are respectively exposed to the corresponding openings 230 of the passivation layer 220. The passivation layer 220 may be composed of a material that is the same as or different from that of IMD layers 214. For example, the passivation layer 220 may be formed of an epoxy, a solder mask, an inorganic material (e.g. silicon nitride ($SiN_X$), silicon oxide ($SiO_X$)), an organic polymer base material, or the like.

In some other embodiments, as shown in FIG. 1, the fan-out wafer-level semiconductor package (FOWLP) 350 of the semiconductor package assembly 500a optionally includes a plurality of vias 228 passing through the molding compound 210. The plurality of vias 228 is disposed on the first surface 302 of the RDL structure 300. The plurality of vias 228 is electrically connected to the plurality of conductive traces 216 of the RDL structure 300. Also, the semiconductor die 200 may be surrounded by the plurality of vias 228. In some embodiments, the plurality of vias 228 may comprise through package vias (TPVs) formed of copper. The plurality of vias 228 may serve as electrical connections to transmit input/output (I/O), ground or power signals from another semiconductor package (not shown) vertically stacked on the semiconductor package assembly 500a to form a three-dimensional (3D) semiconductor package.

As shown in FIG. 1, the fan-out wafer-level semiconductor package (FOWLP) 350 of the semiconductor package assembly 500a also includes conductive structures 226 disposed on the second surface 304 of the RDL structure 300, which is away from the semiconductor die 200. The conductive structures 226 are formed passing through the openings 230 of the passivation layer 220. Also, the conductive structures 226 are in contact with and electrically connected to the corresponding RDL contact pads 218, respectively. It should be noted that no UBM (under bump metallurgy) layer is formed between the RDL contact pads 218 and the corresponding conductive structures 226. In some embodiments, the conductive structures 226 may comprise a conductive bump structure such as a copper bump or a solder bump structure, a conductive pillar structure, a conductive wire structure, or a conductive paste structure.

FIGS. 2A-2H are plan views of areas 450 in FIG. 1. FIGS. 2A-2H show shapes of the RDL contact pads 218a-218h of the RDL structure 300 in accordance with some embodiments of the disclosure. Also, FIG. 2A-2H illustrate the relationship between the redistribution layer (RDL) contact pads 218a-218h and the corresponding conductive trace 216 of the RDL structure 300 in accordance with some embodiments of the disclosure. For clearly showing the arrangement of the RDL contact pads 218a-218h and the corresponding conductive trace 216 of the RDL structure 300, the IMD layers 214, the passivation layer 220 and the conductive structures 226 of the RDL structure 300 are not shown in FIGS. 2A-2H.

In some embodiments, as shown in FIGS. 2A-2H, each of the RDL contact pads 218a-218h may be composed of a symmetrical portion and an extended wing portion connected to the symmetrical portion. For example, each of the RDL contact pads 218a-218d shown in FIGS. 2A-2D comprises a symmetrical portion 318a and an extended wing portion (e.g. extended wing portions 318c-318f) connected to the symmetrical portion 318a. For example, each of the RDL contact pads 218e-218h shown in FIGS. 2E-2H comprises a symmetrical portion 318b and an extended wing portion (e.g. extended wing portions 318c-318f) connected to the symmetrical portion 318b.

In some embodiments, the symmetrical portion 318a of the RDL contact pads 218a-218d and the symmetrical portion 318b of the RDL contact pads 218e-218h have rotational symmetry. For example, the symmetrical portions 318a and 318b can be respectively rotated around a central point 310a of the symmetrical portion 318a in the plan views shown in FIGS. 2A-2D, the symmetrical portion 318b can be rotated around a central point 310b of the symmetrical portion 318b in the plan views shown in FIGS. 2E-2H. In some embodiments, the symmetrical portion has a circular shape (e.g. the symmetrical portion 318a) or an octagonal shape (e.g. the symmetrical portion 318b). In some other embodiments, the symmetrical portion has an oval shape, a round shape or another polygonal shape.

Figure 2A:
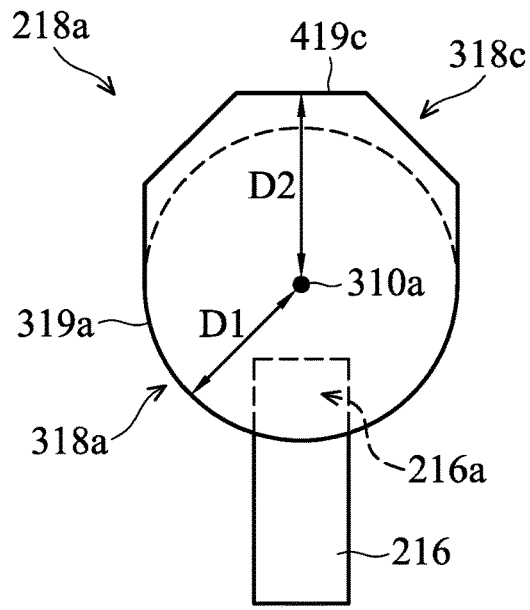
FIG. 2A-2H are plan views showing the shapes of the redistribution layer (RDL) contact pads of a redistribution layer (RDL) structure in accordance with some embodiments of the disclosure.
Figure 2B:
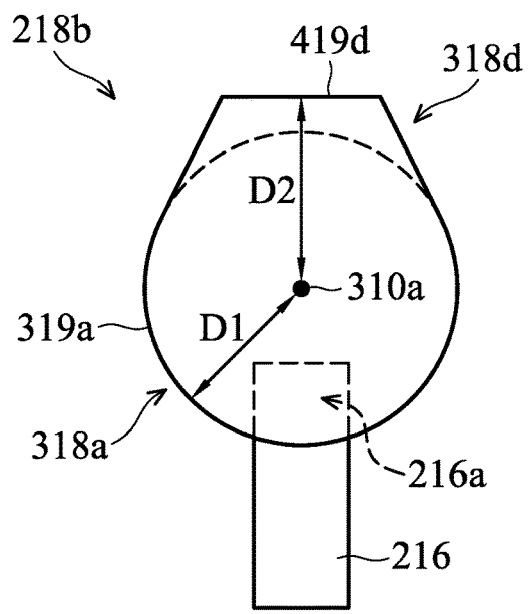
Figure 2C:
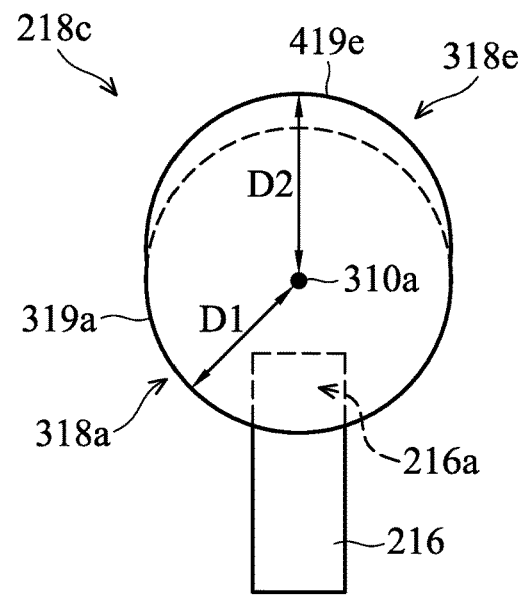

In some embodiments, each of the extended wing portions 318c-318e overlaps at least one half of a boundary 319a of the symmetrical portion 318a when observed from a plan view shown in FIGS. 2A-2C. Therefore, the length of an overlapping portion of the boundary 319a of the symmetrical portion 318a (illustrated as dotted-line), which overlaps the extended wing portions 318c-318e, is at least one-half of the total length of the boundary 319a of the symmetrical portion 318a. In some embodiments, each of the extended wing portions 318d and 318f overlaps less than one half of a boundary 319a of the symmetrical portion 318a when observed from a plan view shown in FIGS. 2B and 2D. Therefore, the length of an overlapping portion of the boundary 319a of the symmetrical portion 318a (illustrated as dotted-line), which overlaps the extended wing portions 318d and 318f, is less than one half of the total length of the boundary 319a of the symmetrical portion 319a. Similarly, each of the extended wing portions 318c-318f overlaps less than one half of a boundary 319b of the symmetrical portion 318b when observed from a plan view shown in FIGS. 2E-2H. Therefore, the length of an overlapping portion of the boundary 319b of the symmetrical portion 318b (illustrated as dotted-line), which overlaps the extended wing portions 318c-318f, is less than one half of the total length of the boundary 319b of the symmetrical portion 318b.

In some embodiments, as shown in FIGS. 2A-2H, the extended wing portions 318c-318f of the RDL contact pads 218a-218h are arranged extending outwardly from the corresponding symmetrical portion (e.g. the symmetrical portion 318a or the symmetrical portion 318b) of the RDL contact pads 218a-218h. In some embodiments, the extended wing portion 318c-318f may be designed to have one or more vertices (i.e. one or more angular points of a polygon) (e.g. the extended wing portion 318c shown in FIGS. 2A and 2E and the extended wing portion 318d shown in FIGS. 2B and 2F) or to have a rounded boundary (e.g. the extended wing portion 318e shown in FIGS. 2C and 2G and the extended wing portion 318f shown in FIGS. 2D and 2H).

Because the RDL contact pads 218a-218h have the extended wing portion, the first distance (e.g. a distance D1) between the center point of the symmetrical portion (e.g. the central point 310a of the symmetrical portion 318a and the central point 310b of the symmetrical portion 318b) and the boundary of the symmetrical portion (e.g. the boundary 319a of the symmetrical portion 318a and the boundary 319b of the symmetrical portion 318b) is different from the second distance (e.g. a distance D2) between the center point of the symmetrical portion and the boundary of the extended wing portion (e.g. a boundary 419c of the extended wing portion 318c, a boundary 419d of the extended wing portion 318d, a boundary 419e of the extended wing portion 318e and a boundary 419f of the extended wing portion 318f). In some embodiments, the first distance is shorter than the second distance.

Figure 2D:
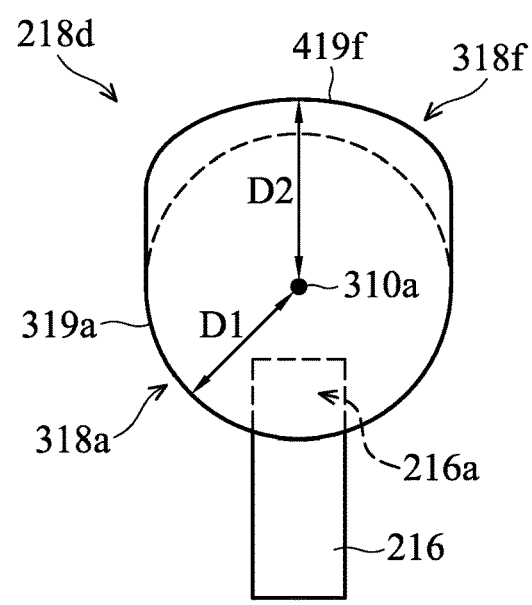
Figure 2E:
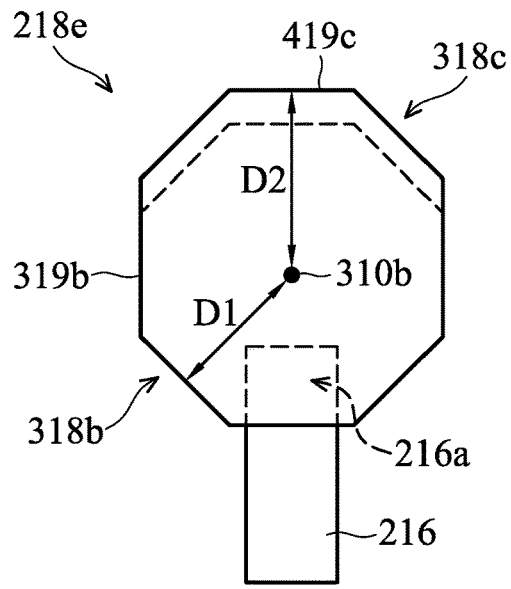
Figure 2F:
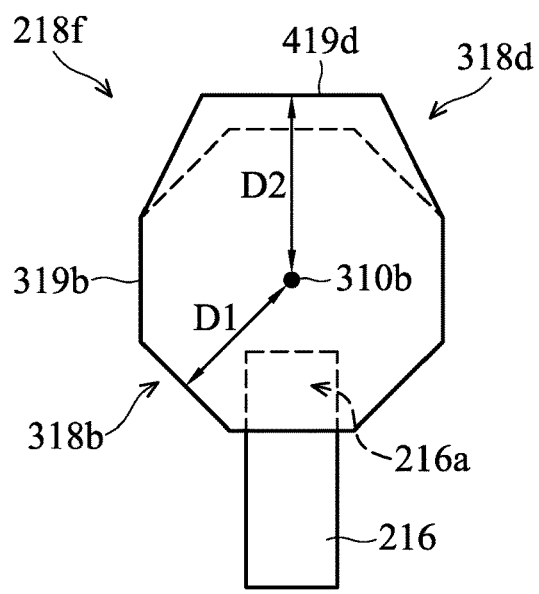
Figure 2G:
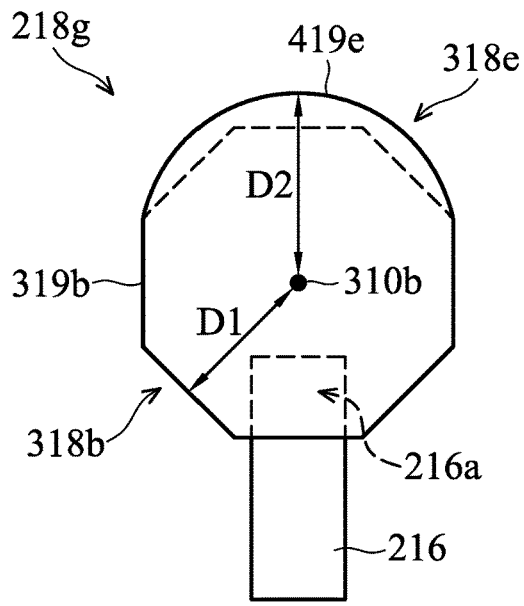
Figure 2H:
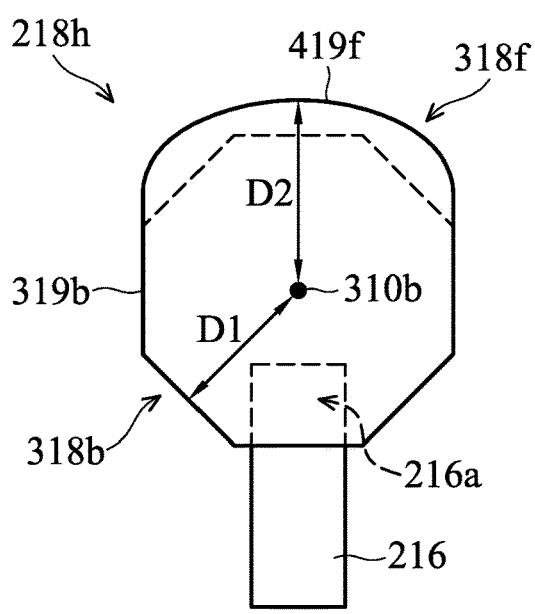
Figure 3A:
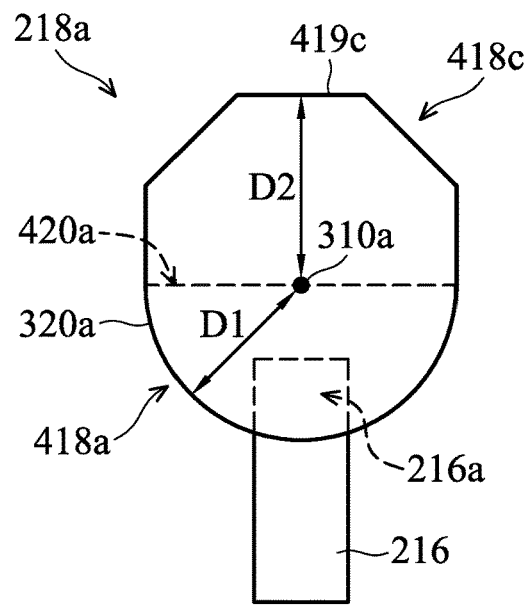
FIG. 3A-3H are plan views showing the shapes of the redistribution layer (RDL) contact pads of a redistribution layer (RDL) structure in accordance with some embodiments of the disclosure.
Figure 3B:
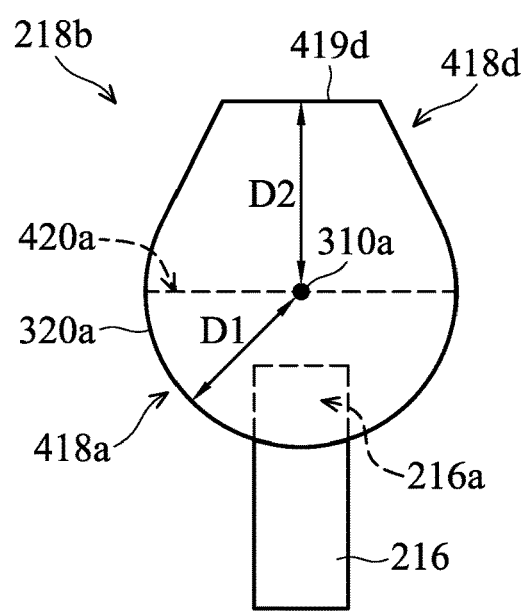
Figure 3C:
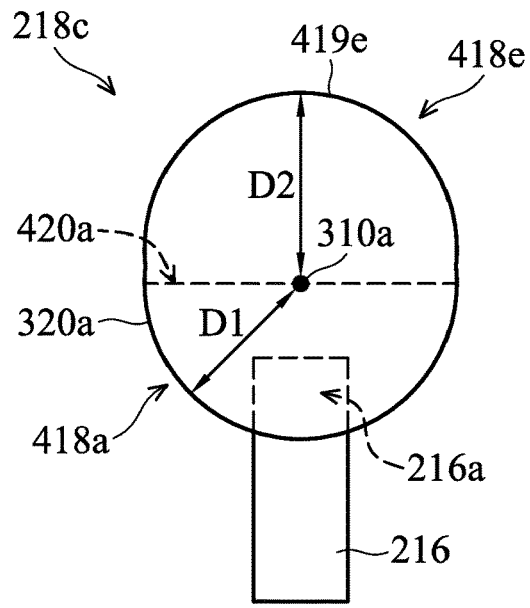
Figure 3D:
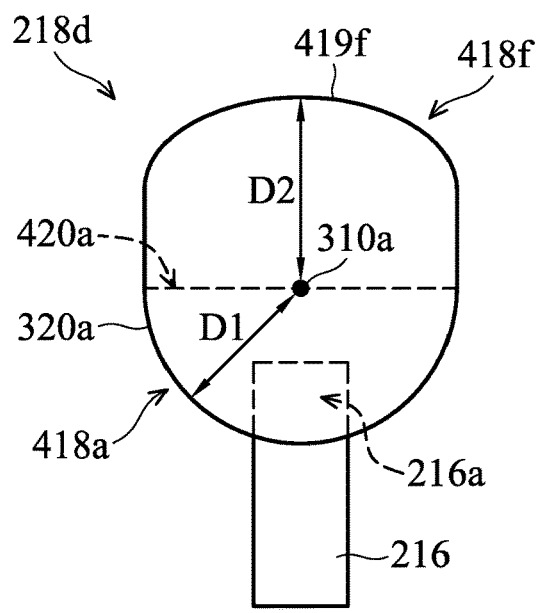
Figure 3E:
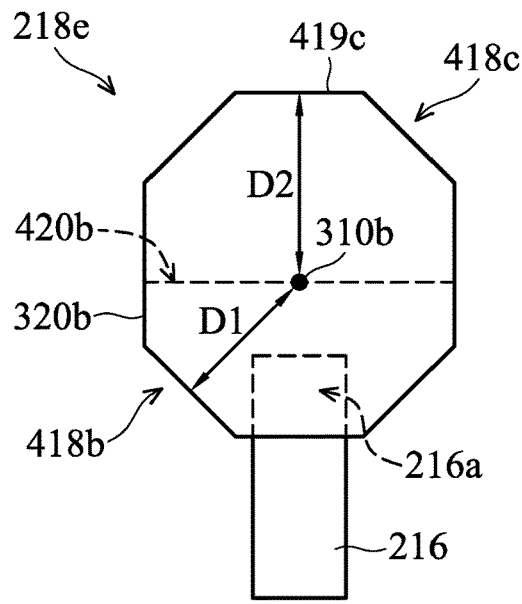
Figure 3F:
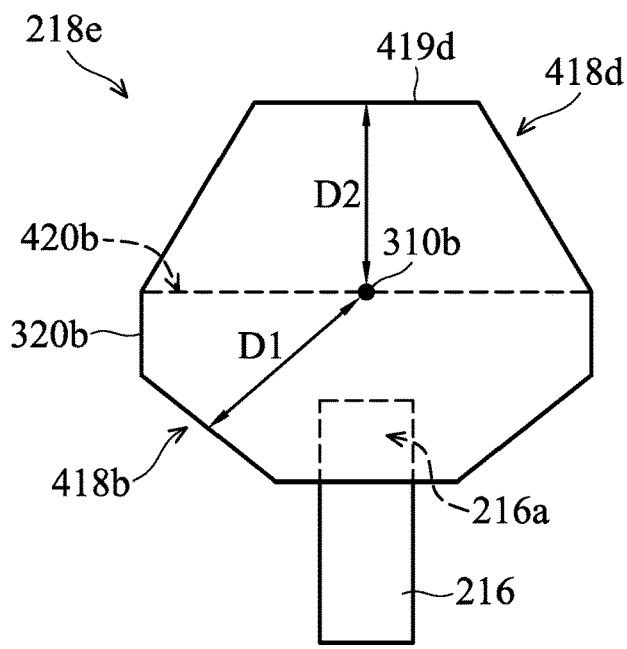
Figure 3G:
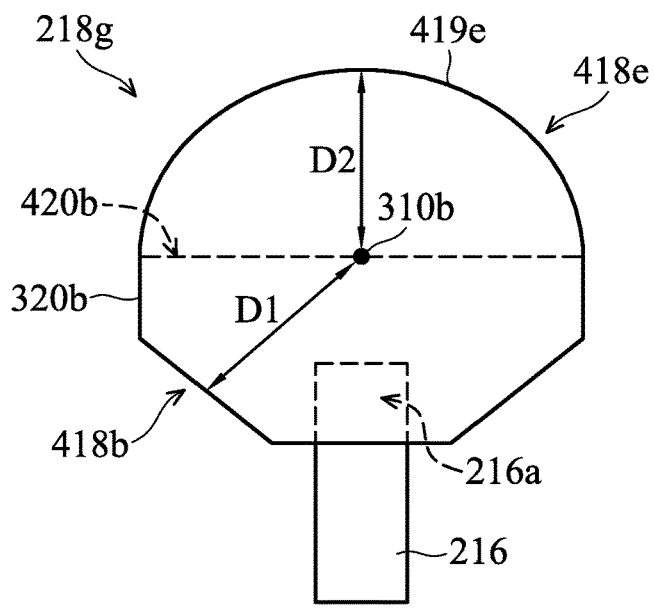
Figure 3H:
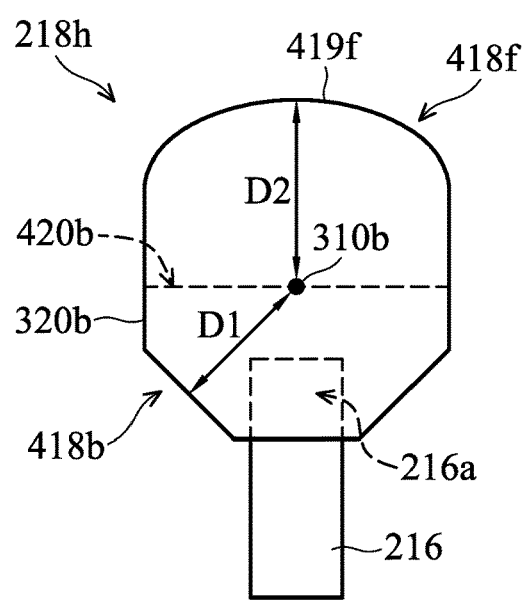

As shown in FIG. 2A, for example, the first distance D1 between the central point 310a of the symmetrical portion 318a and the boundary 319a of the symmetrical portion 318a is different from the second distance D2 between the central point 310a of the symmetrical portion 318a and the boundary 419c of the extended wing portion 318c. As shown in FIG. 2B, for example, the first distance D1 between the central point 310a of the symmetrical portion 318a and the boundary 319a of the symmetrical portion 318a is different from the second distance D2 between the central point 310a of the symmetrical portion 318a and the boundary 419d of the extended wing portion 318d. As shown in FIG. 2C, for example, the first distance D1 between the central point 310a of the symmetrical portion 318a and the boundary 319a of the symmetrical portion 318a is different from the second distance D2 between the central point 310a of the symmetrical portion 318a and the boundary 419e of the extended wing portion 318e. As shown in FIG. 2D, for example, the first distance D1 between the central point 310a of the symmetrical portion 318a and the boundary 319a of the symmetrical portion 318a is different from the second distance D2 between the central point 310a of the symmetrical portion 318a and the boundary 419f of the extended wing portion 318f. Similarly, as shown in FIG. 2E, for example, the first distance D1 between the central point 310b of the symmetrical portion 318b and the boundary 319b of the symmetrical portion 318b is different from the second distance D2 between the central point 310b of the symmetrical portion 318b and the boundary 419c of the extended wing portion 318c. As shown in FIG. 2F, for example, the first distance D1 between the central point 310b of the symmetrical portion 318b and the boundary 319b of the symmetrical portion 318b is different from the second distance D2 between the central point 310b of the symmetrical portion 318b and the boundary 419d of the extended wing portion 318d. As shown in FIG. 2G, for example, the first distance D1 between the central point 310b of the symmetrical portion 318b and the boundary 319b of the symmetrical portion 318b is different from the second distance D2 between the central point 310b of the symmetrical portion 318b and the boundary 419e of the extended wing portion 318e. As shown in FIG. 2H, for example, the first distance D1 between the central point 310b of the symmetrical portion 318b and the boundary 319b of the symmetrical portion 318b is different from the second distance D2 between the central point 310b of the symmetrical portion 318b and the boundary 419f of the extended wing portion 318f.

In some embodiments, as shown in FIGS. 2A-2D, the conductive trace 216 comprises an end portion 216a overlapping the symmetrical portion 318a of the RDL contact pad 218a/218b/218c/218d and extending outward the RDL contact pad 218a/218b/218c/218d. In some embodiments, as shown in FIGS. 2E-2H, the end portion 216a of the conductive trace 216 overlapping the symmetrical portion 318b of the RDL contact pad 218e/218f/218g/218h and extending outward the RDL contact pad 218d/218e/218g/218h.

FIGS. 3A-3H are plan views of areas 450 in FIG. 1. FIGS. 3A-3H show shapes of the RDL contact pads 218a-218h of the RDL structure 300 in accordance with some embodiments of the disclosure. Also, FIG. 3A-3H illustrate the relationship between the redistribution layer (RDL) contact pads 218a-218h and the corresponding conductive trace 216 of the RDL structure 300 in accordance with some embodiments of the disclosure. For clearly showing the arrangement of the RDL contact pads 218a-218h and the corresponding conductive trace 216 of the RDL structure 300, the IMD layers 214, the passivation layer 220 and the conductive structures 226 of the RDL structure 300 are not shown in FIGS. 3A-3H.

From another point of view, each of the RDL contact pads 218a-218h has a chord (e.g. a chord 420a and a chord 420b) that divides the RDL contact pad 218a-218h into a first portion and a second portion in accordance with some embodiments of the disclosure shown in FIGS. 3A-3H. The first portion has at least one half of a first symmetrical shape, and the second portion has at least one half of a second symmetrical shape that is different from the first symmetrical shape when observed from a plan view as shown in FIGS. 3A-3H. Therefore, each of the RDL contact pads 218a-218h is asymmetric to the chord thereof. In addition, the chord of each of the RDL contact pads 218a-218h may serve as a diameter of first symmetrical shape and a diameter of the second symmetrical shape. For example, each of the RDL contact pads 218a-218d shown in FIGS. 3A-3D has a chord 420a that divides each of the RDL contact pads 218a-218d into a first portion 418a and a second portion (e.g. second portions 418c-418f). For example, each of the RDL contact pads 218e-218h shown in FIGS. 3E-3H has a chord 420b that divides each of the RDL contact pads 218e-218h into a first portion 418b and a second portion (e.g. the second portions 418c-418f). In some embodiments, the first portion 418a of each of the RDL contact pads 218a-218d has at least one half of a first symmetrical shape. For example, if the first symmetrical shape has a circular shape, the first portion 418a has a semicircular shape. In some embodiments, the first portion 418b of each of the RDL contact pads 218e-218h has at least one half of a first symmetrical shape. For example, if the first symmetrical shape has an octagonal shape, the first portion 418b has a half octagonal shape. In some other embodiments, the first symmetrical shape comprises an oval shape, a round shape or another polygonal shape.

In some embodiments, the second portions 418c-418f respectively have at least one half of a second symmetrical shape that is different from the first symmetrical shape when observed from a plan view as shown in FIGS. 3A-3H. For example, the second symmetrical shape may comprise a polygonal shape (e.g. a rectangle shape, an octagonal shape or a hexagonal shape), an oval shape or a round shape. In some embodiments, the second portion 418c shown in FIGS. 3A and 3E has a half octagonal shape, the second portion 418d shown in FIGS. 3B and 3F has a half hexagonal shape, the second portion 418e shown in FIGS. 3C and 3G has a half oval shape, and the second portion 418f shown in FIGS. 3D and 3H has a half oval shape.

In some embodiments, the first portion (e.g. the first portion 418a and first portion 418b) of each of the RDL contact pads 218a-218h is surrounded (enclosed) by the chord (e.g. the chord 420a and the chord 420b) and a first boundary portion (e.g. first boundary portions 320a-320b) connecting opposite terminals of the chord 420a. The second portion (e.g. the second portion 418c-418f) of each of the RDL contact pads 218a-218h is surrounded (enclosed) by the chord and a second boundary portion (e.g. the boundaries 419c-419f of the extended wing portions 319c-319f also serve as the second boundary portions of the second portions 418c-418f) connecting opposite terminals of the chord. The opposite terminals of the second boundary portions respectively connect opposite terminals of the first boundary portions of each of the RDL contact pads 218a-218h. Therefore, the first boundary portion and the second boundary portion of each of the RDL contact pads 218a-218h may compose the boundary of each of the RDL contact pads 218a-218h shown in FIGS. 3A-3H.

For example, the first portion 418a of each of the RDL contact pads 218a-218d shown in FIGS. 3A-3D is surrounded by the chord 420a and the first boundary portion 320a connecting opposite terminals of the chord 420a. The second portion 418c/418d/418e/418f of the RDL contact pads 218a/218b/218c/218d shown in FIGS. 3A-3D is surrounded by the chord 420a and the second boundary portion 419c/419d/419e/419f connecting opposite terminals of the chord 420a. For example, the first portion 418b of each of the RDL contact pads 218e-218h shown in FIGS. 3E-3H is surrounded by the chord 420b and the first boundary portion 320b connecting opposite terminals of the chord 420b. The second portion 418c/418d/418e/418f of the RDL contact pads 218e/218f/218g/218h shown in FIGS. 3E-3H is surrounded by the chord 420b and the second boundary portion 419c/419d/419e/419f connecting opposite terminals of the chord 420b.

In some embodiments, the chord 420a of each of the RDL contact pads 218a-218d shown in FIGS. 3A-3D has a center point. The position of the center point of the chord 420a overlaps the center point 310a. Therefore, the center point 310a also serves as the center point of the chord 420a of each of the RDL contact pads 218a-218d shown in FIGS. 3A-3D. In some embodiments, the chord 420b of each of the RDL contact pads 218e-218h shown in FIGS. 3E-3H has a center point. The position of the center point of the chord 420b overlaps the center point 310b. Therefore, the center point 310b also serves as the center point of the chord 420b of each of the RDL contact pads 218e-218h shown in FIGS. 3E-3H.

Because the RDL contact pads 218a-218h is asymmetric to the chord thereof, the first distance (e.g. the distance D1) between the center point (e.g. the center points 310a and 310b) of the chord (e.g. the chord 420a and 420b) and the first boundary portion (e.g. the first boundary portions 320a and 320b) of the first portion (e.g. the first portion 418a and the first portion 418b) is different from the second distance (e.g. the distance D2) between the center point of the chord and the second boundary portion (e.g. the second boundary portions 419c, 419d, 419e and 419f) of the second portion (e.g. the second portions 418c-418f) of each of the RDL contact pads 218a-218h shown in FIGS. 3A-3H. For example, the distance D1 between the center point 310a of the chord 420a and the first boundary portion 320a is different from the distance D2 between the center point 310a of the chord 420a and the second boundary portion 419c/419d/419e/419f of each of the RDL contact pads 218a-218d shown in FIGS. 3A-3D. For example, the distance D1 between the center point 310b of the chord 420b and the first boundary portion 320b is different from the distance D2 between the center point 310b of the chord 420b and the second boundary portion 419c/419d/419e/419f of each of the RDL contact pads 218a-218d shown in FIGS. 3A-3D.

In some embodiments, as shown in FIGS. 3A-3D, the end portion 216a of the conductive trace 216 overlapping the first portion 418a of the RDL contact pad 218a/218b/218c/218d and extending outward the RDL contact pad 218a/218b/218c/218d. In some embodiments, as shown in FIGS. 3E-3H, the end portion 216a of the conductive trace 216 overlapping the first portion 418b of the RDL contact pad 218d/218e/218g/218h and extending outward the RDL contact pad 218d/218e/218g/218h.

Because the semiconductor die 200 and the molding compound 210 are disposed on the RDL structure 300 of the semiconductor package assembly 500a, the RDL structure 300 may suffer the stress produced from the semiconductor die 200 and the molding compound 210. Also, the RDL structure may suffer the stress due to the mismatch of thermal expansion of the coefficient (CTE) between the RDL structure 300 and the semiconductor die 200 (e.g. the CTE of the semiconductor die 200 is about 3 PPM/°C), between the RDL structure 300 and the molding compound 210 (e.g. the CTE of the molding compound 210 is about 9 PPM/°C), and between the semiconductor die 200 and the molding compound 210. Also, the direction of the stress applied on the RDL structure 300 in the die region (the first region 306) may be different from the direction of the stress applied on the RDL structure 300 in the molding region (the second region 308). In consideration of the direction of the stress applied on the RDL structure, the orientation of the extended wing portion of the RDL contact pad in the die region may be different from that of the extended wing portion of the RDL contact pad in the molding compound region of the RDL structure.

Figure 4A:
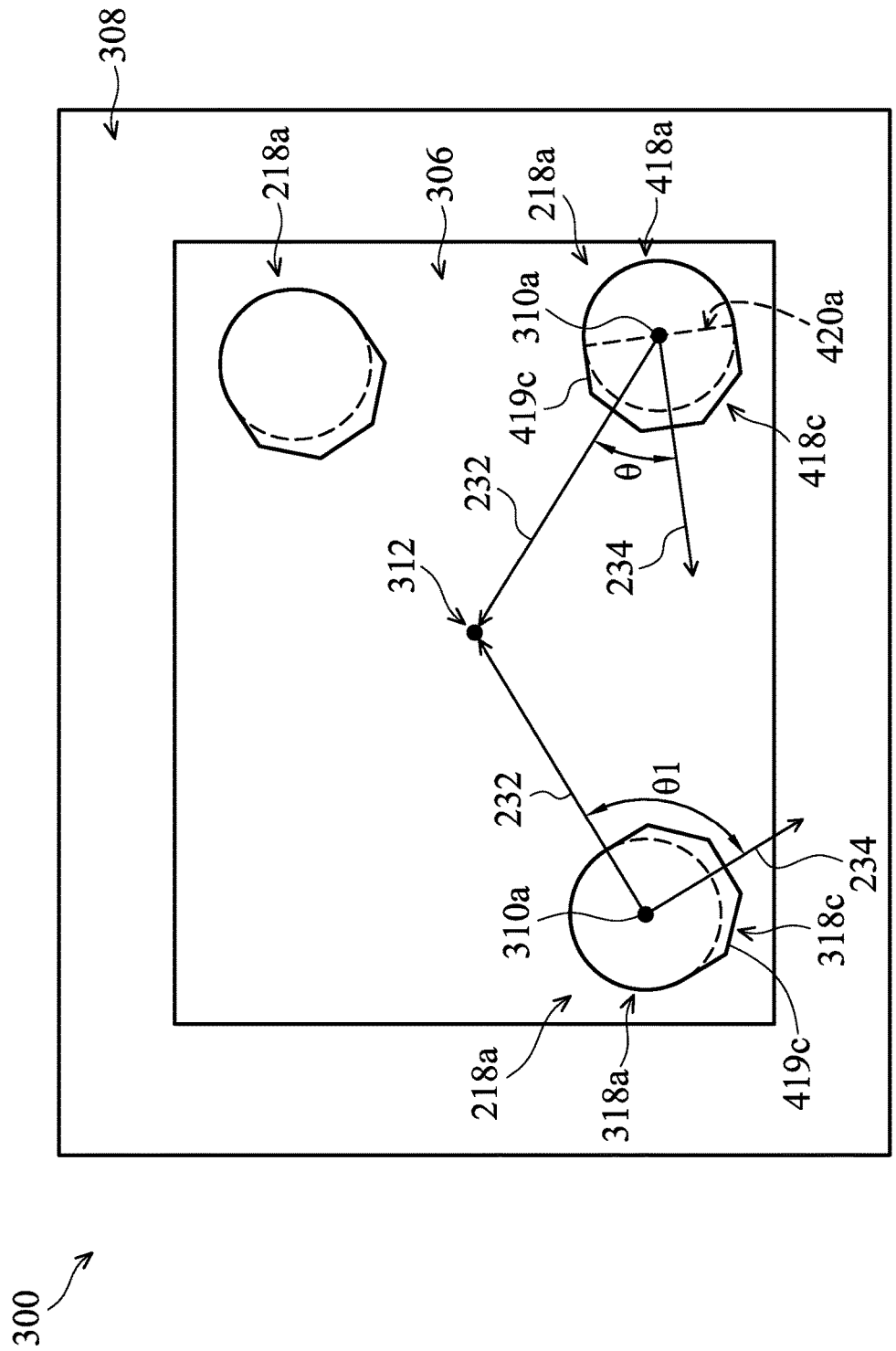
FIG. 4A is a plan view showing the arrangement of a redistribution layer (RDL) contact pad arranged in a molding compound region of a redistribution layer (RDL) structure in accordance with some embodiments of the disclosure.

FIG. 4A is a plan view showing the arrangement of the redistribution layer (RDL) contact pad 218a in the first region 306 (the die region) of the redistribution layer (RDL) structure 300 in accordance with some embodiments of the disclosure. It should be noted that the RDL contact pad 218a is merely an example to show the orientation of the extended wing portion of the RDL contact pad arranged in the die region and is not intended to be limiting to the disclosed embodiment. In some embodiments, when the RDL contact pad 218a is disposed within the first region 306, the angle θ1 between the first direction 232, from the center point 310a of the symmetrical portion 318a to the center point 312 of the first region 306, and the second direction 234, from the center point 310a of the symmetrical portion 318a to the center point 421a of the boundary 419c of the extended wing portion 318c, is in a range from about 0 degrees to about 90 degrees in the clockwise direction or in the counterclockwise direction. In some embodiments, when the RDL contact pad 218a is disposed within the first region 306, the angle θ1 is about 0 degrees.

In other words, when the RDL contact pad 218a is disposed within the first region 306, the angle θ1 between the first direction 232, from the center point 310a of the chord 420a to the center point 312 of the first region 306, and the second direction 234, from the center point 310a of the chord 420a to the center point 421a of the second boundary portion 419c of the second portion 418c, is in a range from about 0 degrees to about 90 degrees in the clockwise direction or in the counterclockwise direction in accordance with some embodiments of the disclosure shown in FIG. 4A.

Figure 4B:
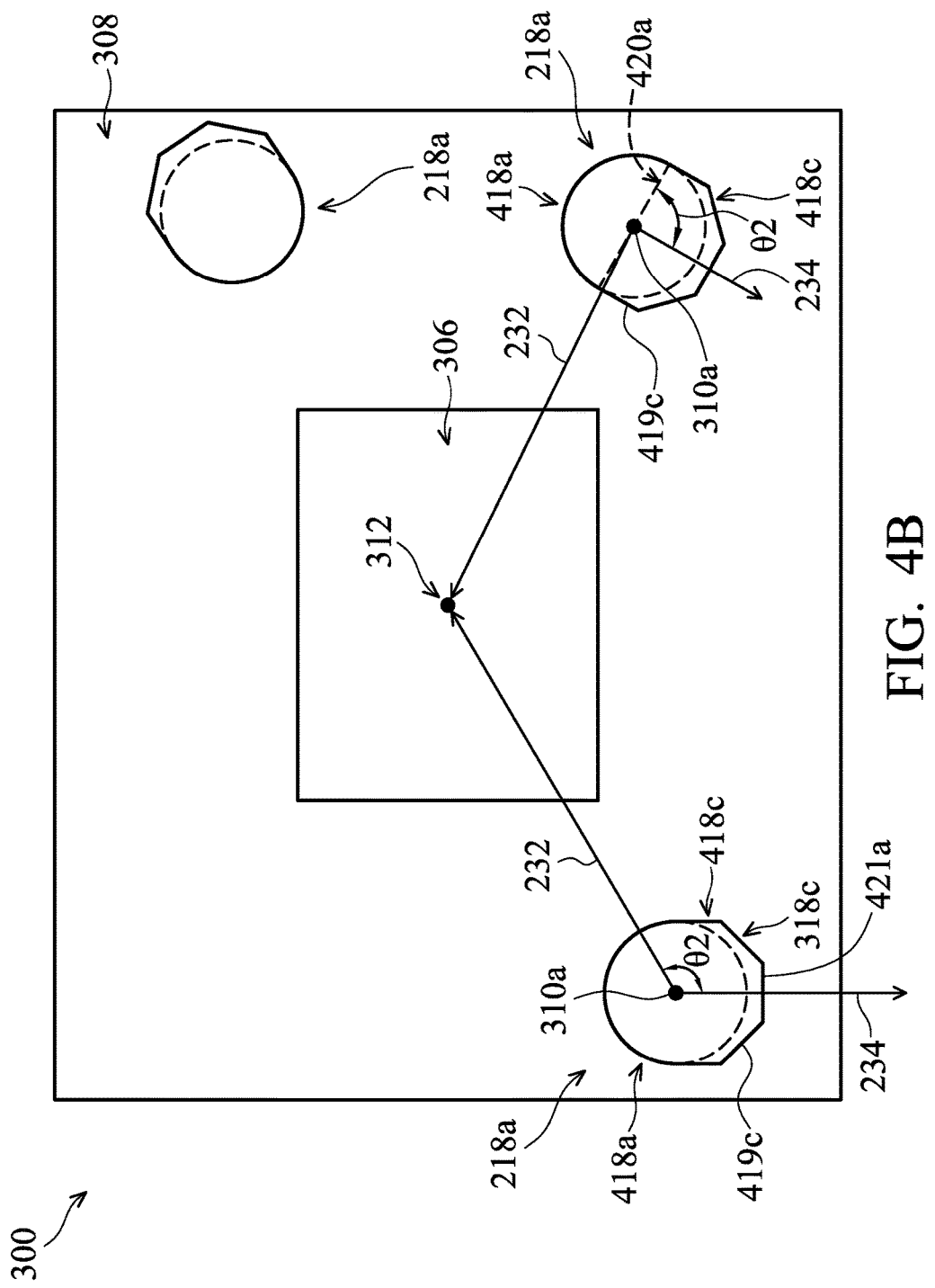
FIG. 4B is a plan view showing the arrangement of a redistribution layer (RDL) contact pad arranged in a die region of a redistribution layer (RDL) structure in accordance with some embodiments of the disclosure.

FIG. 4B is a plan view showing the arrangement of the redistribution layer (RDL) contact pads in the second region 308 (the molding compound region) of a redistribution layer (RDL) structure 300 in accordance with some embodiments of the disclosure. It should be noted that the RDL contact pad 218a is merely an example to show the orientation of the extended wing portion of the RDL contact pad arranged in the molding compound region and is not intended to be limiting to the disclosed embodiment. In some embodiments, when the RDL contact pad is disposed within the second region 308, the angle θ2 between the first direction 232, from the center point 310a of the symmetrical portion 418a to the center point 312 of the first region 306, and the second direction 234, from the center point 310a of the symmetrical portion 318a to the center point 421a of the boundary 419c of the extended wing portion 418c, is in a range from about 90 degrees to about 270 degrees in the clockwise direction. In some embodiments, when the RDL contact pad is disposed within the second region 308, the angle θ2 is about 180 degrees.

In other words, when the RDL contact pad is disposed within the second region 308, the angle θ2 between the first direction 232, from the center point 310a of the chord 420a to the center point 312 of the first region 306, and the second direction 234, from the center point 310a of the chord 420a to the center point 421a of the second boundary portion 419c of the second portion 418c, is in a range from about 90 degrees to about 270 degrees in the clockwise direction in accordance with some embodiments of the disclosure shown in FIG. 4B.

In consideration of the direction of the stress applied on the RDL structure, the relationship between the orientation of the extended wing portion of the RDL contact pad and the orientation of the corresponding conducive trace in the die region may be different than the relationship between the orientation of the extended wing portion of the RDL contact pad and the orientation of the corresponding conducive trace in the molding compound region of the RDL structure.

Figure 5A:
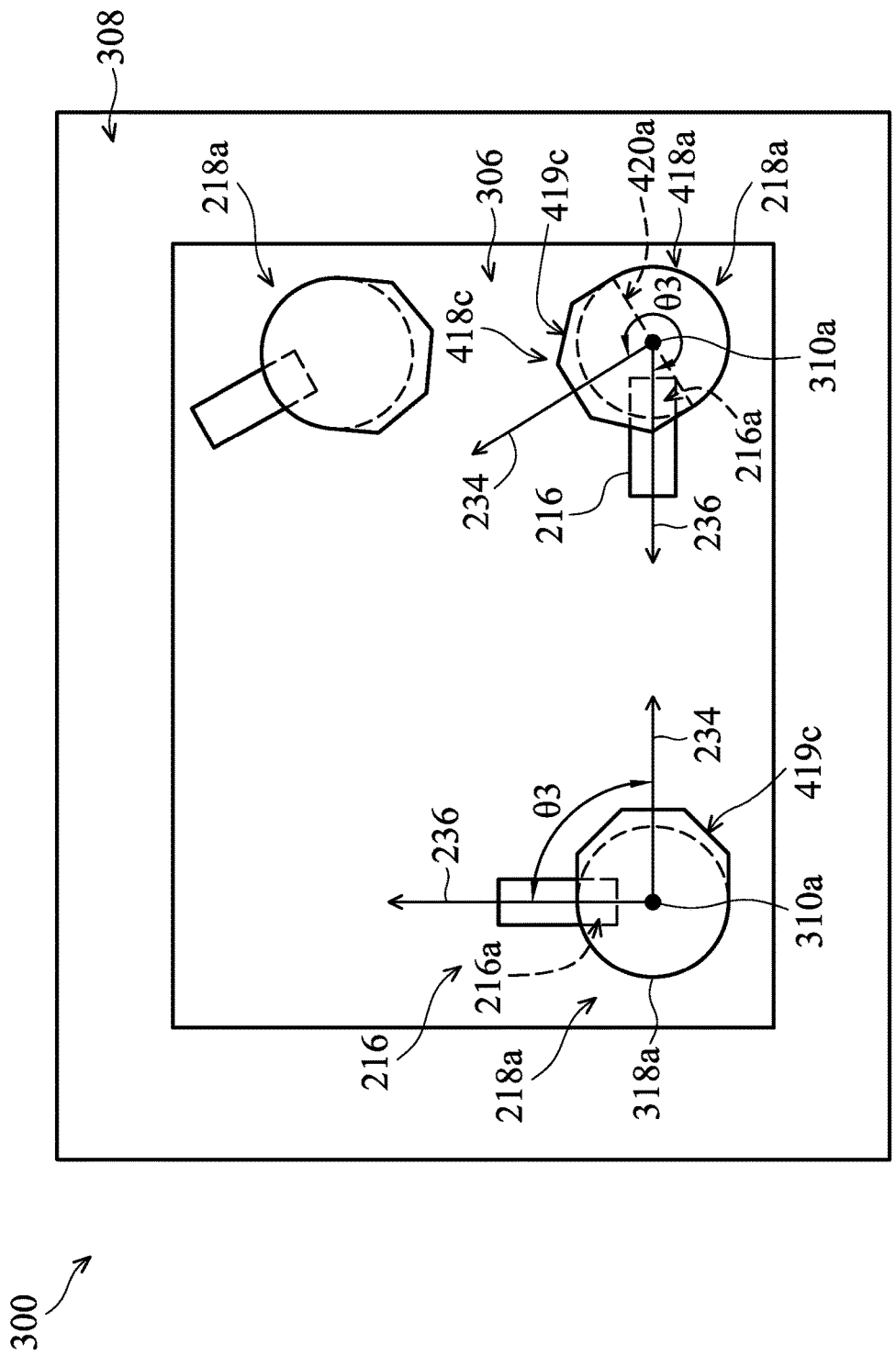
FIG. 5A is a plan view showing the arrangement of a redistribution layer (RDL) contact pad and a conducive trace connected to the RDL contact pad which are arranged in a die region of a redistribution layer (RDL) structure in accordance with some embodiments of the disclosure.

FIG. 5A is a plan view showing the arrangement of the redistribution layer (RDL) contact pad 218a and the conducive trace 216 connected to the RDL contact pad 218a which are arranged in the die region (the first region 306) of the redistribution layer (RDL) structure 300 in accordance with some embodiments of the disclosure. It should be noted that the RDL contact pad 218a is merely an example to show the orientation of the extended wing portion of the RDL contact pad arranged in the die region and is not intended to be limiting to the disclosed embodiment. In some embodiments, as shown in FIG. 5A, the conductive trace 216 comprises an end portion 216a overlapping the symmetrical portion 318a of the RDL contact pad 218a and extending outward the RDL contact pad 218a substantially along the third direction 236. In some embodiments, when the RDL contact pad 218a is disposed within the first region 306, the angle θ3 between the third direction 236 and the second direction 234, from the center point 310a of the symmetrical portion 318a to the center point 421a of the boundary 419c of the extended wing portion 418c, is in a range from about 45 degrees to about 315 degrees in the clockwise direction. In some embodiments, when the RDL contact pad 218a is disposed within the first region 306, the angle θ3 is about 180 degrees.

In other words, when the RDL contact pad 218a is disposed within the first region 306, the angle θ3 between the third direction 236 and the second direction 234, from the center point 310a of the chord 420a to the center point 421a of the second boundary portion 419c of the second portion 418c, is in a range from about 45 degrees to about 315 degrees in the clockwise direction in accordance with some embodiments of the disclosure shown in FIG. 5A.

Figure 5B:
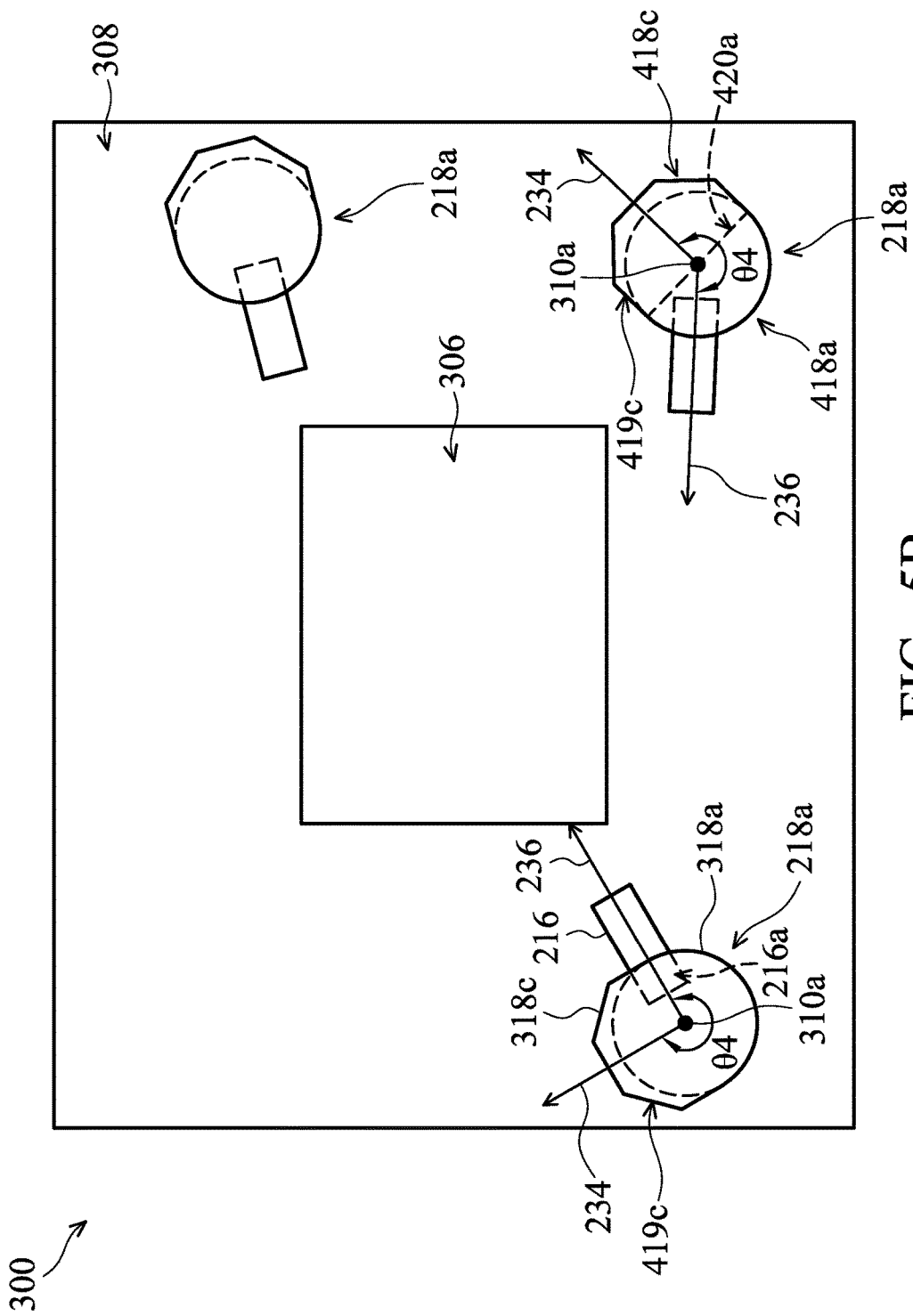
FIG. 5B is a plan view showing the arrangement of a redistribution layer (RDL) contact pad and a conducive trace connected to the RDL contact pad arranged in a molding compound region of a redistribution layer (RDL) structure in accordance with some embodiments of the disclosure.

FIG. 5B is a plan view showing the arrangement of the redistribution layer (RDL) contact pad 218a and the conducive trace 216 connected to the RDL contact pad 218a which are arranged in the molding compound region (the second region 308) of the redistribution layer (RDL) structure 300 in accordance with some embodiments of the disclosure. It should be noted that the RDL contact pad 218a is merely an example to show the orientation of the extended wing portion of the RDL contact pad arranged in the molding compound region and is not intended to be limiting to the disclosed embodiment. In some embodiments, as shown in FIG. 5B, when the RDL contact pad is disposed within the second region 308, the angle θ4 between the third direction 236 and the second direction 234, from the center point 310a of the symmetrical portion 318a to the center point 421a of the boundary 419c of the extended wing portion 318c, is in a range from about 45 degrees to about 315 degrees in the clockwise direction. In some embodiments, when the RDL contact pad 218a is disposed within the second region 308, the angle θ4 is about 180 degrees.

In other words, when the RDL contact pad 218a is disposed within the second region 308, the angle θ4 between the third direction 236 and the second direction 234, from the center point 310a of the chord 420a to the center point 421a of the second boundary portion 419c of the second portion 418c, is in a range from about 45 degrees to about 315 degrees in the clockwise direction in accordance with some embodiments of the disclosure shown in FIG. 5B.

In some embodiments, the design of the RDL contact pads arranged in the die region and the molding compound region of the redistribution layer (RDL) structure can be used in a package-on-package (POP) semiconductor package assembly.

Figure 6:
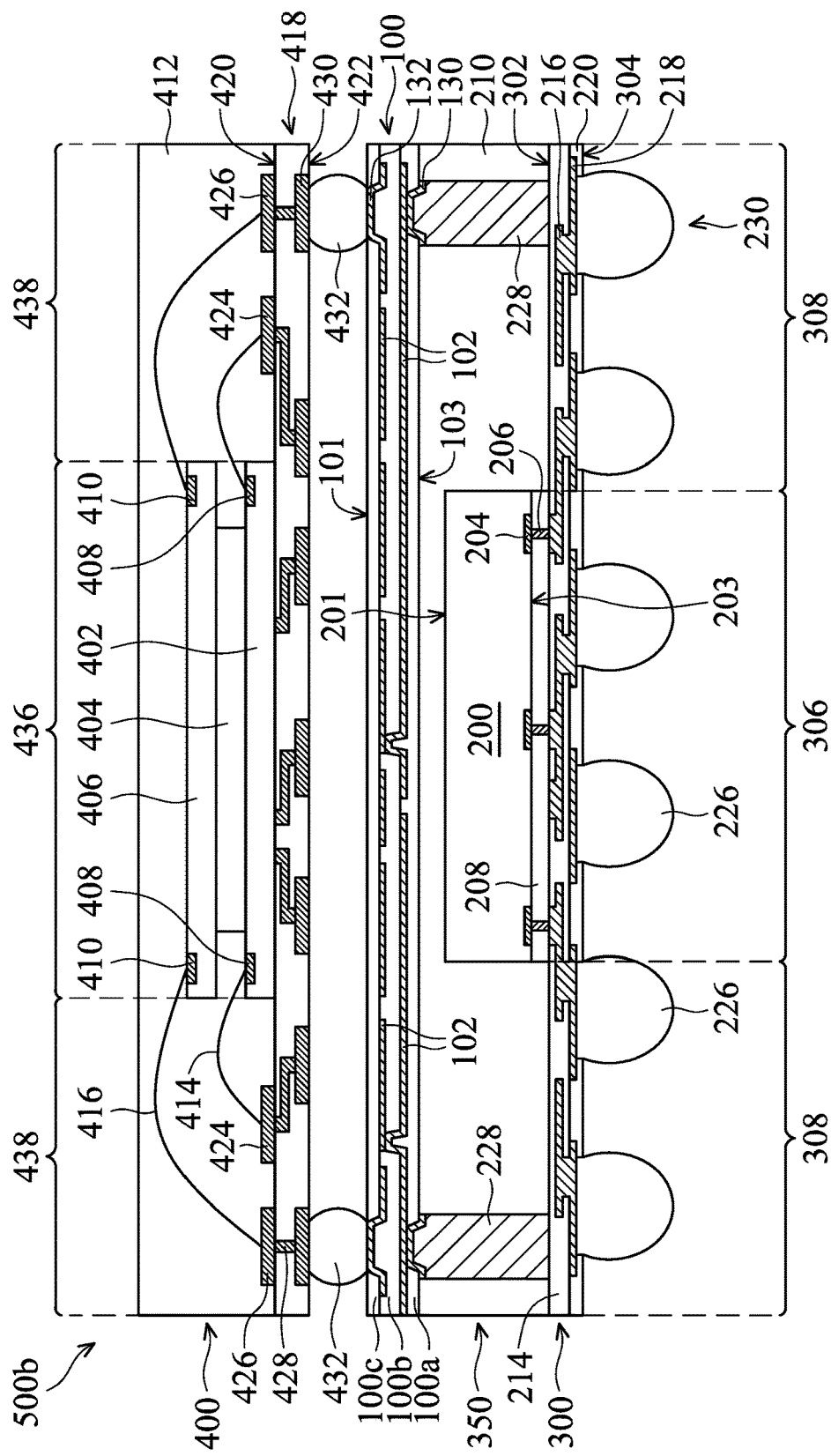
FIG. 6 is a cross-sectional view of a semiconductor package assembly in accordance with some embodiments of the disclosure.

FIG. 6 is a cross-sectional view of a semiconductor package assembly 500b in accordance with some embodiments of the disclosure. Elements of the embodiments hereinafter, that are the same or similar as those previously described with reference to FIG. 1, are not repeated for brevity.

In some embodiments, the semiconductor package assembly 500b includes a flip-chip semiconductor package (i.e. the fan-out wafer-level semiconductor package (FOWLP) 350), and a dynamic random access memory (DRAM) package 400 vertically stacked thereon. The semiconductor package assembly 500b may also serve a package-on-package (POP) semiconductor package assembly. The configurations and/or structures of the fan-out wafer-level semiconductor package (FOWLP) 350 of the semiconductor package assembly 500b may be similar to, or the same as, the fan-out wafer-level semiconductor package (FOWLP) 350 of the semiconductor package assembly 500a shown in FIG. 1. In addition, the design of the RDL contact pads 218 arranged in the die region 306 and the molding compound region 308 of the redistribution layer (RDL) structure 300 of the fan-out wafer-level semiconductor package (FOWLP) 350 of the semiconductor package assembly 500b may be similar to, or the same as, those of the semiconductor package assembly 500a (FIG. 1), and the details thereof are not repeated herein. It should be noted that the fan-out wafer-level semiconductor package (FOWLP) 350 and the dynamic random access memory (DRAM) package 400 used in the semiconductor package assembly 500b is merely an example and is not intended to be limiting to the disclosed embodiment.

In some embodiments, as shown in FIG. 6, the fan-out wafer-level semiconductor package (FOWLP) 350 further includes an RDL structure 100. The dynamic random access memory (DRAM) package 400 connects and is electrically coupled to the fan-out wafer-level semiconductor package (FOWLP) 350 through the RDL structure 100. The RDL structure 100 is disposed over the back-side surface 201 of the semiconductor die 200. The RDL structure 100 is electrically coupled to the RDL structure 300 of the fan-out wafer-level semiconductor package (FOWLP) 350. The RDL structure 100 has opposite surfaces 101 and 103. The surface 101 of the RDL structure 100 is in contact with the molding compound 210 of the fan-out wafer-level semiconductor package (FOWLP) 350. The surface 103 is close to the dynamic random access memory (DRAM) package 400.

As shown in FIG. 6, the RDL structure 100 may have one or more conductive traces 102 disposed in one or more IMD layers, for example, IMD layers 100a-100c. The RDL structure 100 may also include RDL contact pads 130 and 132 electrically coupled to the corresponding conductive traces 102. The RDL contact pads 130, which are close to the surface 103, are electrically coupled to the plurality of vias 228. The RDL contact pads 132, which are close to the surface 101, are electrically coupled to a plurality of conductive structures 432 of the dynamic random access memory (DRAM) package 400. The conductive traces 102 of the RDL structure 100 are electrically connected to the RDL structure 300, which is disposed over the front-side surface 203 of the semiconductor die 200, through RDL contact pads 130 and the plurality of vias 228. However, it should be noted that the number of conductive traces 102 and the number of IMD layers 100a-100c shown in FIG. 6 is only an example and is not a limitation to the present invention.

In some embodiments, as shown in FIG. 6, the RDL structure 100, which is referred to as a fan-out structure, may be designed to fan out from one or more of the plurality of vias 228, the positions of which have been redistributed by the RDL structure 100. Therefore, the RDL structure 100 may provide design flexibility for the electrical connections between the fan-out wafer-level semiconductor package (FOWLP) 350 and the dynamic random access memory (DRAM) package 400.

In some embodiments, as shown in FIG. 6, the RDL structure 100 includes a first region, which is corresponding to the first region 306, and a second region, which is corresponding to the second region 308 and is directly covered by the molding compound 210. In some embodiments, the RDL contact pads 130 and 132 of the RDL structure 100 may be designed to have an extended wing portion, which is similar to the design of the RDL contact pads 218 arranged in the first region (the die region) 306 and the second region (the molding compound region) 308 of the redistribution layer (RDL) structure 300 of the FOWLP 350. In some embodiments, the orientation of the extended wing portion of the RDL contact pads 130 and 132 arranged in the first region (the die region) and the second region (the molding compound region) of the RDL structure 100 is similar to the orientation of the extended wing portion of the RDL contact pad 218 arranged in the die region 306 and the molding compound region 308 of the RDL structure 300 of the FOWLP 350.

As shown in FIG. 6, the DRAM package 400 is stacked on the FOWLP 350 by a bonding process. In some embodiments, the DRAM package 400 includes a low-power double data rate DRAM (LPDDR DRAM) package following the pin assignment rule (such as JEDEC LPDDR I/O Memory specification). Alternatively, the DRAM package 400 may include a Wide I/O DRAM package. In one embodiment, the DRAM package 400 includes a body 418 and at least one DRAM die, for example, three DRAM dies 402, 404 and 406, stacked thereon. The body 418 has a die-attach surface 420 and a bump-attach surface 422 opposite to the die-attach surface 420. In this embodiment, as shown in FIG. 6, there are three DRAM dies 402, 404 and 406 mounted on the die-attach surface 420 of the body 418. The DRAM die 404 is stacked on the DRAM die 402 through a paste (not shown), and the DRAM die 406 is stacked on the DRAM die 404 through a paste (not shown). The DRAM dies 402, 404 and 406 may be coupled to the body 418 by bonding wires, for example bonding wires 414 and 416. However, the number of stacked DRAM devices is not limited to the disclosed embodiment. Alternatively, the three DRAM dies 402, 404 and 406 as shown in FIG. 6 can be arranged side by side. Therefore, the DRAM dies 402, 404 and 406 are mounted on die-attach surface 420 of the body 418 by paste. The body 418 may comprise circuitry 428 and metal pads 424 and 426 and 430. The metal pads 424 and 426 are disposed on the top of the circuitry 428 close to the die-attach surface 420. The metal pads 430 are disposed on the bottom of the circuitry 428 close to the bump-attach surface 422. The circuitry 428 of the DRAM package 400 is interconnected with the conductive traces 102 of the RDL structure 100 and the conductive traces 216 of the RDL structure 300 via the plurality of conductive structures 432, which is disposed on the bump-attach surface 422 of the body 418. In some embodiments, the conductive structures 432 may comprise a conductive bump structure such as a copper bump or a solder bump structure, a conductive pillar structure, a conductive wire structure, or a conductive paste structure. In some embodiments, the DRAM package 400 is electrically coupled to the conductive traces 216 of the RDL structure 300 by the RDL structure 100 and the vias 228 passing through the molding compound 210 between the DRAM package 400 and the RDL structure 300 of the FOWLP 350.

In one embodiment, as shown in FIG. 6, the DRAM package 400 further includes a molding compound 412 covering the die-attach surface 420 of the body 418, encapsulating the DRAM dies 402, 404 and 406, the bonding wires 414 and 416. In some embodiments, the body 418 of the DRAM package 400 also serves as a RDL structure comprising a first region 436, which is provided for the DRAM dies 402, 404 and 406 disposed thereon, and a second region 438, which surrounds the first region 436 and is directly covered by the molding compound 412. In some embodiments, the metal pads 430, which is close to the bump-attach surface 422 of the body 418, of the DRAM package 400 may be designed to have an extended wing portion, which is similar to the design of the RDL contact pads 218 arranged in the die region 306 and the molding compound region 308 of the redistribution layer (RDL) structure 300 of the FOWLP 350. In some embodiments, the orientation of the extended wing portion of the metal pads 430 arranged in the die region 436 and the molding compound region 438 of the body 418 of the DRAM package 400 is similar to the orientation of the extended wing portion of the RDL contact pad 218 arranged in the die region 306 and the molding compound region 308 of the RDL structure 300 of the FOWLP 350.

Embodiments provide a semiconductor package assembly, for example, a fan-out wafer-level semiconductor package (FOWLP). The semiconductor package assembly has a redistribution layer (RDL) structure to redistribute and fan-out one or more of the die pads with a small pitch. Also, the RDL structure includes a conductive trace, with a redistribution layer (RDL) contact pad electrically coupled to the conductive trace. In some embodiments, the RDL contact pad is composed of a symmetrical portion and an extended wing portion connected to the symmetrical portion. The extended wing portion overlaps at least one half of the boundary of the symmetrical portion when observed from a plan view. In some embodiments, the first distance between the center point of the symmetrical portion and the boundary of the symmetrical portion is different from the second distance between the center point of the symmetrical portion and the boundary of the extended wing portion. In some embodiments, the RDL contact pad has a chord that divides the RDL contact pad into a first portion and a second portion. The first portion has at least one half of a first symmetrical shape, and the second portion has at least one half of a second symmetrical shape that is different from the first symmetrical shape when observed from a plan view.

In some embodiments, the RDL contact pad of the RDL structure having the extended wing portion may help to relieve the stress from the semiconductor die and the molding compound due to the mismatch of CTE between the RDL structure and the semiconductor die, between the RDL structure and the molding compound, and between the semiconductor die and the molding compound. In consideration of the directions of the stress applied on the die region and the molding compound region of the RDL structure, the orientation of the extended wing portion of the RDL contact pad arranged in the die region may be different from that of the extended wing portion of the RDL contact pad arranged in the molding compound region of the RDL structure. Also, the relationship between the orientation of the extended wing portion of the RDL contact pad and the orientation of the corresponding conducive trace in the die region may be different from that in the molding compound region of the RDL structure. Therefore, the reliability of the semiconductor package assembly is improved. In addition, the problem of cracks forming at the interface between the RDL contact pad and the conductive structure (e.g. the conductive bump structure or the solder ball) can be avoided.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:
a redistribution layer (RDL) structure, wherein the RDL structure comprises:
    a conductive trace; and
    a redistribution layer (RDL) contact pad electrically coupled to the conductive trace, and the RDL contact pad is composed of a symmetrical portion and an extended wing portion connected to the symmetrical portion,
wherein the RDL structure comprises a first region for a semiconductor die to be disposed thereon and a second region surrounding the first region, and the extended wing portion of the RDL contact pad is offset from a center of the first region.

2. The semiconductor package assembly as claimed in claim 1, wherein a first distance between a center point of the symmetrical portion and the boundary of the symmetrical portion is different from a second distance between the center point of the symmetrical portion and a boundary of the extended wing portion.

3. The semiconductor package assembly as claimed in claim 1, wherein the symmetrical portion comprises a circular shape, an oval shape, a round shape or a polygonal shape.

4. The semiconductor package assembly as claimed in claim 2, wherein the extended wing portion overlaps at least one-half of a boundary of the symmetrical portion when observed from a plan view.

5. The semiconductor package assembly as claimed in claim 4, wherein the RDL contact pad is disposed within the first region, and an angle between a first direction, from the center point of the symmetrical portion to the center point of the first region, and a second direction, form the center point of the symmetrical portion to a center point of the boundary of the extended wing portion, is in a range from about 0 degrees to about 90 degrees in the clockwise direction or in the counterclockwise direction.

6. The semiconductor package assembly as claimed in claim 4, wherein the RDL contact pad is disposed within the second region, and an angle between a first direction, form the center point of the symmetrical portion to the center point of the first region, and a second direction, form the center point of the symmetrical portion to a center point of the boundary of the extended wing portion, is in a range from about 90 degrees to about 270 degrees in the clockwise direction.

7. The semiconductor package assembly as claimed in claim 4, wherein the conductive trace comprises an end portion overlapping the symmetrical portion of the RDL contact pad and extending outward the RDL contact pad substantially along a third direction.

8. The semiconductor package assembly as claimed in claim 7, wherein the RDL contact pad is disposed within the first region, and an angle between the third direction and a fourth direction, from the center point of the wing portion, is in a range from about 45 degree to about 315 degree in the clockwise direction.

9. The semiconductor package assembly as claimed in claim 7, wherein the RDL contact pad is disposed within the second region, and an angle between the third direction and a fourth direction, from the center point of the symmetrical portion to a center point of the boundary of the extended wing portion, is in a range from about 45 degrees to about 315 degrees in the clockwise direction.

10. The semiconductor package assembly as claimed in claim 4, further comprising:
    a molding compound surrounding the semiconductor die, being in contact with a first surface of the RDL structure in the second region and the semiconductor die, which is disposed on the first surface of the RDL structure; and
    a conductive structure in contact with and electrically connected to the RDL contact pad, which is arranged close to a second surface opposite to the first substrate.

11. A semiconductor package assembly, comprising:
    a redistribution layer (RDL) structure, wherein the RDL structure comprises:
        a conductive trace; and
        a redistribution layer (RDL) contact pad electrically coupled to the symmetrical portion and an extended wing portion connected to the first portion,
    wherein the RDL structure comprises a first region for a semiconductor die to be disposed thereon and a second region surrounding the first region, and the extended wing portion of the RDL contact pad is offset from a center of the first region.

12. The semiconductor package assembly as claimed in claim 11, wherein the extended wing portion overlaps at least one-half of the boundary of the symmetrical portion when observed from a plan view.

13. The semiconductor package assembly as claimed in claim 11, wherein the symmetrical portion comprises a circular shape, an oval shape, a round shape or a polygonal shape.

14. The semiconductor package assembly as claimed in claim 11, wherein a first distance between a center point of the symmetrical portion and a boundary of the symmetrical portion is different from a second distance between the center point of the symmetrical portion and a boundary of the extended wing portion.

15. The semiconductor package assembly as claimed in claim 14, wherein the RDL contact pad is disposed within the first region, and an angle between a first direction, from the center point of the symmetrical portion to a center point of the first region, and a second direction, form the center point of the symmetrical portion to the center point of the boundary of the extended wing portion, is in a range from about 0 degrees to about 90 degrees in the clockwise direction or in the counterclockwise direction.

16. The semiconductor package assembly as claimed in claim 14, wherein the RDL contact pad is disposed within the second region, and an angle between a first direction, form the center point of the symmetrical portion to the center point of the first region, and a second direction, from the center point of the symmetrical portion to a center point of the boundary of the extended wing portion, is in a range from about 90 degrees to about 270 degrees in the clockwise direction.

17. The semiconductor package assembly as claimed in claim 14, wherein the conductive trace comprises an end portion overlapping the symmetrical portion of the RDL contact pad and extending outward the RDL contact pad substantially along a third direction.

18. The semiconductor package assembly as claimed in claim 17, wherein an angle between the third direction and a fourth direction, from the center point of the symmetrical portion to a center point of the boundary of the extended wing portion, is in a range from about 45 degrees to about 315 degrees in the clockwise direction.

19. A semiconductor package assembly, comprising:
- a redistribution layer (RDL) structure, wherein the RDL structure comprises:
  - a conductive trace; and
  - a redistribution layer (RDL) contact pad electrically coupled to the conductive trace, and the RDL contact pad comprising a first portion and a second portion, wherein the first portion is a first symmetrical shape, the second portion has different shape from the first portion,
- wherein the RDL structure comprises a first region for a semiconductor die to be disposed thereon and a second region surrounding the first region, and the extended wing portion of the RDL contact pad is offset from a center of the first region.

20. The semiconductor package assembly as claimed in claim 19, wherein the RDL contact pad has a chord that divides the RDL contact pad into a first portion and a second portion, wherein the first portion has at least one-half of a first symmetrical shape, and the second portion has at least one-half of a second symmetrical shape that is different from the first symmetrical shape when observed from a plan view.

21. The semiconductor package assembly as claimed in claim 20, wherein:
- the first portion is surrounded by the chord and a first boundary portion connecting opposite terminals of the chord,
- the second portion is surrounded by the chord and a second boundary portion connecting opposite terminals of the chord.

22. The semiconductor package assembly as claimed in claim 21, wherein a first distance between a center point of the chord and the first boundary portion of the first portion is different from a second distance between the center point of the chord and the second boundary portion of the second portion.

23. The semiconductor package assembly as claimed in claim 20, wherein the first symmetrical shape and the second symmetrical shape comprise a circular shape, an oval shape, a round shape or a polygonal shape.

24. The semiconductor package assembly as claimed in claim 22, wherein the RDL contact pad is disposed within the first region, and an angle between a first direction, from the center point of the chord to a center point of the first region, and a second direction, from the center point of the chord to a center point of the second boundary portion of the second portion, is in a range from about 0 degrees to about 90 degrees in the clockwise direction or in the counterclockwise direction.

25. The semiconductor package assembly as claimed in claim 22, wherein the RDL contact pad is disposed within the second region, and an angle between a first direction, from the center point of the chord to a center point of the first region, and a second direction, from the center point of the chord to a center point of the second boundary portion of the second portion, is in a range from about 90 degrees to about 270 degrees in the clockwise direction.

26. The semiconductor package assembly as claimed in claim 22, wherein the conductive trace comprises an end portion overlapping the RDL contact pad and extending outward the RDL contact pad substantially along a third direction.

27. The semiconductor package assembly as claimed in claim 26, wherein an point of the chord to a center point of the second boundary portion of the second portion, is in a range from about 45 degrees to about 315 degrees in the clockwise direction.

28. The semiconductor package assembly as claimed in claim 20, further comprising:
- a molding compound surrounding the semiconductor die, being in contact with a first surface of the RDL structure in the second region and the semiconductor die, which is disposed on the first surface of the RDL structure; and
- a conductive structure in contact with and electrically connected to the RDL contact pad, which is arranged close to a second surface opposite to the first substrate.

* * * * *